(12) United States Patent
Johnson

(10) Patent No.: US 7,259,982 B2
(45) Date of Patent: Aug. 21, 2007

(54) READING PHASE CHANGE MEMORIES TO REDUCE READ DISTURBS

(75) Inventor: Brian G. Johnson, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 207 days.

(21) Appl. No.: 11/029,981

(22) Filed: Jan. 5, 2005

(65) Prior Publication Data

US 2006/0146600 A1 Jul. 6, 2006

(51) Int. Cl.
*G11C 11/00* (2006.01)
(52) U.S. Cl. ..................... 365/163; 365/113
(58) Field of Classification Search .............. 365/163, 365/113, 148, 159
See application file for complete search history.

(56) References Cited

U.S. PATENT DOCUMENTS

| 6,590,807 | B2 | 7/2003 | Lowrey | 365/175 |
| 6,667,900 | B2 | 12/2003 | Lowrey et al. | 365/171 |
| 2003/0067013 | A1* | 4/2003 | Ichihara et al. | 257/200 |
| 2004/0022085 | A1* | 2/2004 | Parkinson et al. | 365/113 |
| 2006/0227592 | A1* | 10/2006 | Parkinson et al. | 365/148 |

* cited by examiner

*Primary Examiner*—Anh Phung
(74) *Attorney, Agent, or Firm*—Trop, Pruner & Hu, P.C.

(57) ABSTRACT

Read disturbs in phase change memories may be reduced by progressively reducing the read pulse falling edges. This may reduce the possibility of quenching and inadvertent amorphization of at least a portion of the bit. As a result, in some embodiments, read disturbs may be reduced.

12 Claims, 3 Drawing Sheets

READING PHASE CHANGE MEMORIES TO REDUCE READ DISTURBS

BACKGROUND

This invention relates generally to semiconductor memories.

Phase change memory devices use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between different detectable states of local order across the entire spectrum between completely amorphous and completely crystalline states.

Typical materials suitable for such an application include various chalcogenide elements. The state of the phase change materials is also non-volatile, absent application of excess temperatures, such as those in excess of 150° C. for extended times. When the memory is set in either a crystalline, semi-crystalline, amorphous, or semi-amorphous state representing a resistance value, that value is retained until reprogrammed, even if power is removed. This is because the programmed value represents a phase or physical state of the material (e.g., crystalline or amorphous).

Phase change memories, like other memory types, may be subject to so-called read disturbs. A read disturb occurs when there is a partial or even complete change of state after a bit is read successively. Thus, the read margin may be reduced, reducing the performance of the memory.

Therefore, there is a need for ways to reduce read disturbs in phase change memories.

DETAILED DESCRIPTION

Figure 1:
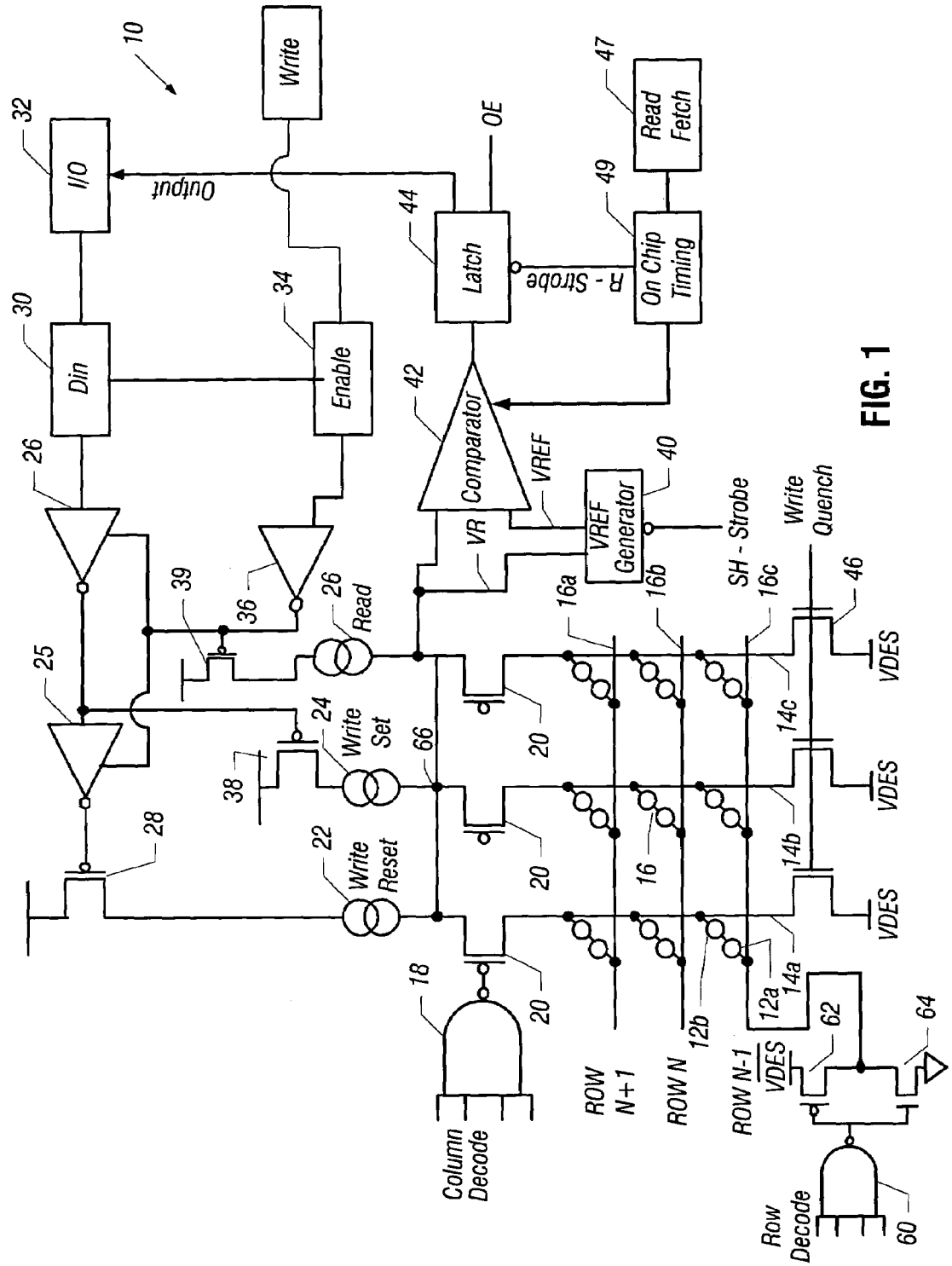
FIG. 1 is a circuit diagram for one embodiment of the present invention.

Referring to FIG. 1, a memory 10 may include an array of memory cells 12 arranged in rows 16 and columns 14 in accordance with one embodiment of the present invention. While a relatively small array is illustrated, the present invention is in no way limited to any particular size of an array. While the terms "rows" and "columns" are used herein, they are merely meant to be illustrative and are not limiting with respect to the type and style of the sensed array.

The memory also includes a number of auxiliary lines, useful for the operation thereof. In particular, the memory is provided with a supply voltage line distributing a supply voltage through a chip including the memory, that, depending on the specific memory device embodiment, may be, typically, from 1 to 3 V, for example 1.8 V. A further supply voltage line (such as a ground voltage line GND) distributes the ground voltage or a negative voltage. A high voltage supply line provides a relatively high voltage, generated by devices (e.g. charge-pump voltage boosters not shown) integrated on the same chip, or externally supplied to the memory; for example 4.5-5 V that may, for example, be helpful during write.

The cell 12 may be any memory cell including a phase change memory cell. Examples of phase change memory cells include those using a chalcogenide memory element 12b and a threshold device 12a that may be an ovonic threshold switch (OTS). A select or threshold device is an ovonic threshold switch that can be made of an alloy of chalcogenide that does not switch from an amorphous to a crystalline phase and which undergoes a rapid, electric field initiated change in conductivity, a change in conductivity that persists only so long as a holding current through the device is present.

In the case illustrated, a cell 12 includes an access, select, or threshold device 12a, as well as a sensing device 12b which actually stores a bit of data. The threshold device 12a may have a reduced snapback voltage, such as 0.6V, as the difference between the threshold Vth(ots) and holding voltage Vh(ots). In one embodiment, that snapback voltage of the threshold device 12a (such as an OTS device) is less than the minimum threshold voltage of the memory element 12b by a reasonable margin that is adequate for reading with good margin a reset bit state without the voltage across the sensing device 12b exceeding its threshold voltage when the select device 12a thresholds (triggers after the current exceeds Ithreshold). Upon thresholding, the voltage across 12a snaps back from Vth (threshold voltage) to Vh (holding voltage), a difference that may be less than Vth(oum) of the memory element 12b.

A decoder 18 receives address signals to select the desired column using transistors 20 uniquely associated with each column for cell selection. A reset write current source 22 is coupled to node 66 in parallel with a set write current source 24 and a read current source 26 in series with a resistor R in this example. The read current may exceed the threshold current of the memory element 12b and be set to generate a fast rise time on the selected column (14a or 14b or 14c, with selection determined by the "on" select transistors 20a or 20b or 20c). The current sources are coupled to selected columns as needed in response to addressing commands from an external memory user such as a processor. A set of transistors 46a or 46b or 46c may be located on the bottom of the columns 14 in order to enable write quenching and deselect by assuring fast write current pulse trailing edge on columns 14. Fast quench is also assisted by simultaneous switching of the row from select to deselect voltage.

Transistors 28, 38, and 39 are on/off switches that select the desired current, generated by current source 22, 24 or 26, to the selected column 14 depending on whether the function desired respectively is to write a bit to its reset state, or write to the set state, or read the selected bit. A NOR gate 36 either disables read by enabling write Din gates, or turns on transistor 36 to enable the read current source 26. Unless enabled, gates 25 and 26 turn off the write current sources, 22 and 24. The gate 36 is controlled by enable circuit 34. An input/output (I/O) control 32 is coupled to the data in (Din) circuit 30, which is coupled to select either write 0 or write 1 through selection of either current source 22 or 24, one having less write current to write a 0 (and crystallize) than the other that resets the selected bit to a 1 (amorphous). The Data-in circuit 30 is write enabled by 34 through gate 36.

A sense amplifier 42, in the form of a comparator in one embodiment, receives one input from a selected column, for example 14c, being read. The sense amplifier 42 may optionally include a pre-charge circuit to pre-charge node 66 and the selected column of columns 14a, b or c to a pre-charged voltage by means apparent to one reasonably skilled in the art. The sense amplifier 42 and reference voltage generator 40, which may force a voltage that stays relatively fixed during the read cycle, may be provided on each column 14 in one embodiment, but more preferably, as shown, is shared across an array of column lines to minimize related layout area. The on-chip timing 49 for the sense amplifier 42 and data output latch 44 may provide an output enable (OE) signal as an option which at least indicates when the output can be driven, though usually OE is also furnished by the processor to enable the output driver to a low impedance state (once the data is ready from the read cycle) to avoid bus conflict to and from the processor if Din is on the same pin as Dout.

The output signal from the latch 44 is controlled by a read (R) strobe in that the whole read fetch cycle is started by the equivalent of a read signal, again usually furnished by a processor. Alternatively, this signal may be generated on-chip by sensing an address change when write is not selected.

The reference generator 40 produces a reference voltage VREF which may be higher than a column voltage driven by a set bit but lower in voltage than a column driven by a reset bit, a column voltage that may be clamped or limited to force across the memory element 12b less than the threshold voltage, and the voltage clamp may preferably be lower than this voltage by 0.5V for margin. The set state corresponds to a lower resistance value and the reset state corresponds to a higher resistance value. Approximately, VREF may be set at the voltage on the selected column 14 above the holding voltage of the device 12a (e.g., about 2V) plus one-half the approximately 1V threshold voltage of the device 12b (e.g., about 1V), for a total of about 2.5V, to provide reasonable margin between the one and zero states of the cell.

However, here the set bit may be detected indirectly. A reset bit has a high resistance times a relatively high read current such as 50 microAmps, so if allowed to charge indefinitely, the voltage across the device 12b alone would be 5V or greater for a 100K or greater reset bit. However, once the column of the reset bit exceeds VREF, the current is turned off, stopping further charging to avoid triggering the reset bit. This also signals that the bit is a one (reset) which is latched and sent to the output.

Figure 2A:
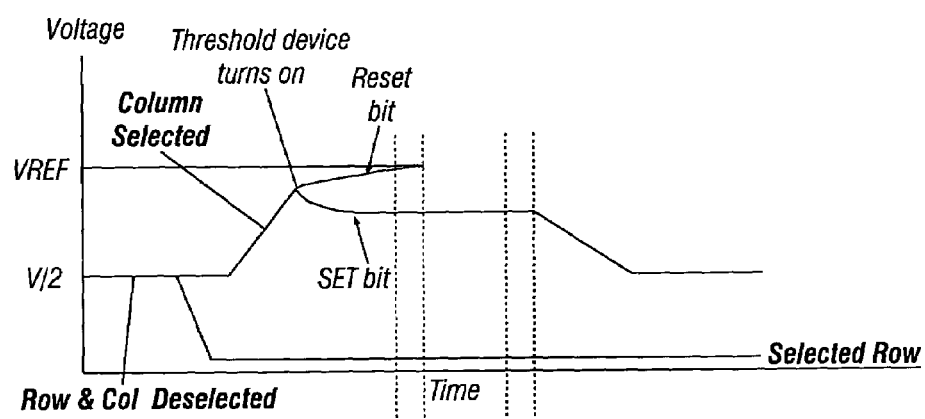
FIG. 2A is a theoretical depiction of voltage versus time for a selected column in accordance with one embodiment of the present invention without using actual data.

In contrast, a set bit may have a voltage across memory element 12b less than 0.5V (column voltage less than 2.5V). Thus, when reading a column with a selected bit in the set state, the column voltage either reaches VREF very slowly or not at all as indicated in FIG. 2A.

Figure 2B:
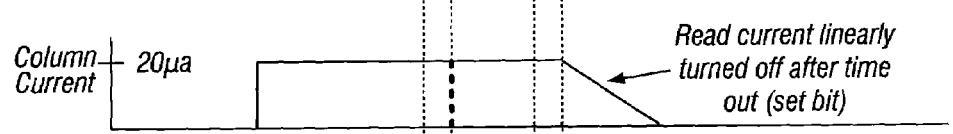
FIG. 2B is a theoretical depiction of the read current driven into the selected column versus time in accordance with one embodiment of the present invention without using actual data.
Figure 2C:
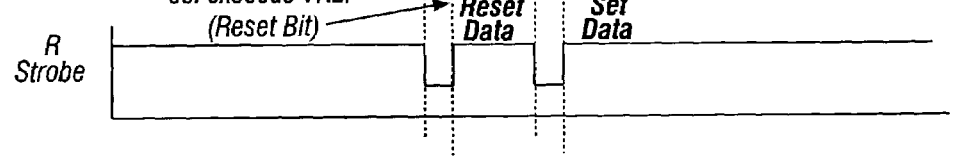
FIG. 2C is a theoretical depiction of the read strobe data latch voltage versus time in accordance with one embodiment of the present invention without using actual data.

Accordingly, for better margin, a timeout may be used that may begin when the column read cycle begins. If the column voltage exceeds VREF before the timeout ends, the bit is latched as reset and the current stops when the column reaches VREF. Otherwise, the bit is set and the current is stopped when the time-out ends (and before the column reaches VREF). With this approach, the comparator output is in the correct state for latching (low when the column exceeds VREF which triggers latching, and high if VREF is not exceeded by the timeout from the on-chip timing 49 which triggers latching if VREF has not earlier been exceeded). Shown in FIG. 2C are these two timing alternatives to latch reset data (the earlier negative going edge reflects the column reaching VREF) and the second position of latching data reflects time-out (because the column has not reached VREF due to accessing a set bit).

In one embodiment, the phase change material used in the sensing device 12b may be suitable for non-volatile memory data storage. The phase change material may be a material having electrical properties (e.g., resistance) that may be changed through the application of energy such as, for example, heat, light, voltage potential, or electrical current.

Examples of phase change materials may include a chalcogenide material. A chalcogenide material may be a material that includes at least one element from column VI of the periodic table or may be a material that includes one or more of the chalcogen elements, e.g., any of the elements of tellurium, sulfur, or selenium. Chalcogenide materials may be non-volatile memory materials that may be used to store information that is retained even after the electrical power is removed.

In one embodiment, the phase change material may be chalcogenide element composition from the class of tellurium-germanium-antimony ($Te_xGe_ySb_z$) material or a GeSbTe alloy, such as 2,2,5, although the scope of the present invention is not limited to just these materials.

In one embodiment, if the memory material is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state. Accordingly, in this embodiment, the memory material may be adapted to be altered to a particular one of a number of resistance values within a range of resistance values to provide digital or analog storage of information.

Programming of the memory material to alter the state or phase of the material may be accomplished by applying voltage potentials or forcing current into or out of the selected lines 14, 16, thereby generating a voltage potential across the memory material. An electrical current may flow through a portion of the memory material in response to the applied voltage potentials and current forced, and may result in heating of the memory material.

This controlled heating and subsequent controlled cooling may alter the memory state or phase of the memory material. A slow trailng edge of the write pulse on the column to row voltage difference assists in crystallizing a bit into the "set" state. Fast reduction in the column to row voltage difference across the memory cell after applying write current or voltage better assures amorphizing the bit into the "reset" state.

Altering the phase or state of the memory material may alter an electrical characteristic of the memory material. For example, resistance of the material may be altered by altering the phase of the memory material. Either all or a portion of the phase change memory material may be altered during the writing pulse (i.e. only a portion/region of sensing device 12b adjacent to either the top or bottom electrode may be phase changed during the write operation). In one embodiment, primarily the portion of memory material that undergoes phase change is the region that is adjacent to the smaller, more resistive lower electrode. The memory material may also be referred to as a programmable resistive material or simply a programmable resistance material.

In one embodiment, a voltage pulse with a potential difference of about 1.5 volts may be applied across the memory material by applying about 0 volts to a lower line (e.g., a row 16) and forcing a current, such as 2 ma, into the upper line (e.g., a column 14), so that more than 1 V develops across the memory element 12b after the select element 12a (in FIG. 1) is activated or triggered into a low impedance state. A current flowing through the memory material in response to the applied voltage potentials may result in heating of the memory material. This heating and subsequent cooling may alter the memory state or phase of the material.

In a "reset" state, the memory material may be in an amorphous or semi-amorphous state. In a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted, such as referring to a reset bit as a logic "0" and a set bit as a logic "1."

Due to electrical current, the memory material may be heated to a relatively higher temperature and then subsequently cooled at a fast rate to amorphisize memory material and "reset" memory material, such as by using the quench transistors 46 in FIG. 1. Heating the volume or memory material to a relatively lower crystallization temperature may crystallize and "set" the memory material, using a lower current or a slow trailing edge.

The information stored in memory material may be read by measuring the resistance of the memory material. As an example, a read current may be provided to the memory material using opposed lines 14, 16 and a resulting read voltage across the memory material may be compared against a reference voltage using, for example, the sense amplifier 42. The read voltage may be proportional to the resistance exhibited by the selected memory storage device 12b.

In a low voltage or low field regime, the device 12a is off and may exhibit very high resistance in some embodiments. The off resistance can, for example, range from 50,000 ohms to greater than 10 gigaohms at a bias of half the threshold voltage. The device 12a may remain in its off state until exceeding a threshold voltage or until a current greater than threshold current switches the device 12a to a highly conductive, low resistance on state. The voltage across the device 12a after turn on drops to a slightly lower voltage, called the holding voltage $V_{HOTS}$ and remains very close to this holding voltage almost regardless of current flowing, since the dynamic resistance is low, frequently less than 1000 ohms (now in series with its holding voltage). In one embodiment of the present invention, as an example, the threshold voltage of the device 12a may be on the order of 3 volts and the holding voltage may be on the order of 2.5V volts, where the difference may be less than the threshold voltage of the memory storage material, Vthoum.

After passing through the snapback region, in the on state, the device 12a voltage drop remains close to the holding voltage as the current passing through the device is increased, even if up to a relatively high, current level. Above that current level, the device remains on but displays a finite differential resistance with the voltage drop increasing with increasing current. The device 12a may remain on until the current through the device 12a is reduced below a characteristic holding current value that is dependent on the area of the material and the holding voltage may be affected by the choice of top and bottom electrodes utilized to form the device 12a.

The snapback voltage of the device 12a may be reduced to be less than the threshold voltage of the memory element 12b, Vthoum, to avoid triggering a reset bit as it is selected, such as by raising the column 14 and lowering the row 16. The snapback voltage is the threshold voltage minus the holding voltage of the threshold device 12a. The threshold voltage is where the dynamic resistance of the device switches from high to low. In one embodiment, the snapback voltage of the device 12a of about 0.5V is less than half the minimum threshold voltage of the memory element 12b of about 1V. In another embodiment, the snapback voltage is less than the minimum threshold voltage of the element 12b minus about 600 mV. If necessary to improve margin against triggering a reset bit, the reset bit current used may be increased on-chip above the minimum necessary reset current to increase the threshold voltage, thus improving margin against triggering the reset memory bit(s) during read. For example, if during operation of the memory in the field, excessive error correcting (Hamming) code (ECC) errors are detected, the write current may be increased in increments of, for example, 10% until ECC errors are reduced.

The snapback voltage of the threshold element (OTS) 12a may be reduced by reducing the threshold voltage and/or increasing the holding voltage. The threshold voltage may be reduced, for example, by reducing the thickness of the switching material, and/or altering its composition. The holding voltage may be increased, for example, by changing the type or composition of electrodes that apply a potential across the switching material. Or, for example, to obtain Vth at a high voltage with reduced Vsnapback, Vh may be increased by placing several lower Vth select devices 12a in series within the memory cell.

In some embodiments of the present invention, the threshold device 12a does not change phase. It remains permanently amorphous and its current-voltage characteristics may remain about the same throughout its operating life.

As an example, for a 0.5 micrometer diameter device 12a formed of TeAsGeSSe having respective atomic percents of 16/13/15/1/55, the holding current may be on the order of 0.1 to 1 micro-amps (uA) in one embodiment. Below this holding current, the device 12a turns off and returns to the high resistance regime at low voltage, low field applied. The threshold current for the device 12a may generally be of the same order as the holding current. The holding current may be altered by changing process variables, such as the top and bottom electrode material and the chalcogenide material, and/or the contact area between the electrodes and chalcogenide. The device 12a may provide high "on current" for a given area of device compared to conventional access devices such as metal oxide semiconductor field effect transistors or bipolar junction transistors or semiconductor diodes. However, such devices may also be used in some embodiments, as shall be apparent to one skilled in the art as an adaptation of the embodiments and descriptions herein.

Referring to FIG. 2A, the column voltage level over time is shown for a selected column and row in accordance with one hypothetical embodiment. In standby or when deselected, the column voltages are approximately equal to V/2, where V is related to the threshold voltages of devices 12a and 12b, and may be adjusted die to die by trimming using techniques familiar to those skilled in the art. For example, V may be 2V if the threshold voltage of device 12a is typically 3V with Vh of 2.5V, and the threshold voltage of device 12b is typically 1V with Vh of 0.5V. Other biasing schemes with better voltage margin but increased standby leakage may be used, such as deselecting the columns to 1/3V and the rows to 2/3V when a block is active (and otherwise putting both to zero volts).

During selection of a cell for read or write, the selected column voltage goes high and the selected row voltage goes low. While deselected, row 16 has an initially higher voltage such as V/2, which falls rapidly, upon selection, to a steady low select voltage which may be near zero depending on row driver sizing and the amount of column current. The deselected column 14 has a relatively lower deselect voltage such as V/2 which increases as the column is selected. The selected column voltage increases upon selection, as shown in FIG. 2A. FIG. 2B shows how the selected column current steps up to 50 ua for read (or 2 ma for write), forcing the selected column voltage in FIG. 2A to rise after the column current is applied, as shown in FIG. 2B.

The read column current is greater than the threshold current of the threshold element 12a and may be greater than the threshold current of the memory element 12b, because, in the embodiment shown in FIG. 2A, the column charging is stopped before the voltage across the memory element 12b exceeds the threshold voltage of the memory element 12b.

As shown in FIG. 2A, the column 14 voltage may cross the VREF voltage after the threshold device 12a turns on, and in a relatively fast time if the bit is reset because, with the higher resistance in the cell, most of the read current charges bit line capacitance instead of being diverted into the cell if the bit is in the lower resistance set state. If the bit is set, the column 16 voltage may not cross VREF or does so much later, and preferably only after an on-chip adjustable timer 49 has timed out and the data has been latched as set or "1."

The timer 49 can be started at the beginning of the cycle when the read fetch cycle is requested and the column starts high. Or, the column can be timed out by a column charge rate sensor. Either the set bit changes the column charging rate substantially, signaling to latch the bit as set (to present to the output I/O), or the column reaches VREF, signaling to latch the bit as reset. Thus, the column current may be linearly turned off (FIG. 2B) before the memory element 12b triggers by comparing to VREF and stopping the read current if VREF is reached on the column during read.

VREF is a voltage set low enough to avoid applying more than a threshold voltage across the memory element 12b. Stopping the column voltage at or below VREF prevents a reset memory element 12b from thresholding and entering the dV/dI region, which could necessitate refreshing the bit periodically. Such refreshing involves rewriting the bit after reading it, to maintain its higher resistance state, and may add to the read cycle time and reduce endurance.

Despite using a read current greater than Ithoum, the reset bit sense cycle may be terminated prior to memory element triggering in various ways. After a timeout delay from starting the column high, the read current may be linearly turned off as the column voltage is compared to a reference voltage, checking to see if it is above or below. The timeout needs to be longer than the time necessary to trigger the select device 12a but less than the time necessary for a fully reset bit to exceed Vthoum after 12a triggers.

In one embodiment, fixed timing without feedback or sensing the column voltage may be used wherein the column has time to exceed a reference voltage and both are inputs to a comparator, with the output latched after the time delay. Though it is the simplest, this approach may suffer from variations in the bit line capacitance and threshold of the select device 12 a cell to cell and column to column. If the variations are enough, the time delay may be too fast so the column has not yet exceeded Vthots, suggesting the result is not affected by the memory cell resistance state. Or, the time delay may be too slow, allowing the column voltage to exceed both Vthots and Vthoum if the bit is reset. Hence, some feedback may be desirable to both sense the cell and prevent the column from exceeding Vthoum when the cell is in a reset state.

In another embodiment shown in FIGS. 1 and 2, the column voltage is compared to a VREF voltage. If exceeded, the column current can be linearly stopped and the bit state determined and latched as reset (not necessarily in that sequence). A sense amplifier 42 may sense when the column exceeds the reference voltage and the device current can be cut off (as indicated in the bold vertical dashed lines in FIG. 2B) if the bit is reset. The data can be latched and output to the I/O pin 32 after the current is cut off (FIG. 2C). Otherwise, after allowing an additional time interval (such as 20 nsec.), if the reference voltage has not been exceeded, then the bit is a set bit. Here again, the current may be cut off (FIG. 2B) and a set bit is latched (FIG. 2C) and output to the I/O output pin 32.

For reduced access delay time and once VREF is exceeded when accessing a reset bit, the read current is linearly stopped to avoid triggering the memory cell 12b. After triggering the select device 12a, the column voltage snaps to Vh and charges further from there. For low set cell resistances of less than 10,000 ohms and read currents of 50 ua, the voltage across the cell is primarily the holding voltage since the voltage across the memory is limited to less than 0.5V as the column charges. Similarly, if the cell is reset, further capacitive charging continues from this ots holding voltage as Vinitial, so the voltage at any later time is related.

By progressively reducing the read current after the set bit is identified, read disturbs may be reduced. Non-volatile memories require the capability for successive read and verification operations over a lifetime of the memory.

A bit in the set state can gain resistance with successive reads if the read condition has a voltage/current level or shape where melting or partial melting of the chalcogenide material occurs. In reading phase change memories, the combination of fixed read conditions and a large distribution of set bit resistances can lead to a tail distribution where some bits are marginal to a safe read/verification pulse and, thus, subject to disturb over many successive reads.

The read pulse for a set bit has a falling edge slope or falling edge time duration that is sufficiently long that quenching of a partial region of the chalcogenide is prevented. The slowed down falling edge may ensure crystallization of the material during the falling edge time duration. In one embodiment, the duration of the falling edge may be approximately 10 nanoseconds.

By modifying the duration and time for ending the read pulse for set bits, the read voltage can have a larger magnitude which translates into larger read current for read sensing circuitry to work with, thus, improving performance in some embodiments. Even if a bit were to see some small region where amorphization had occurred, the set bit read pulse ends with the crystallizing step that can reverse that amorphization.

Figure 3:
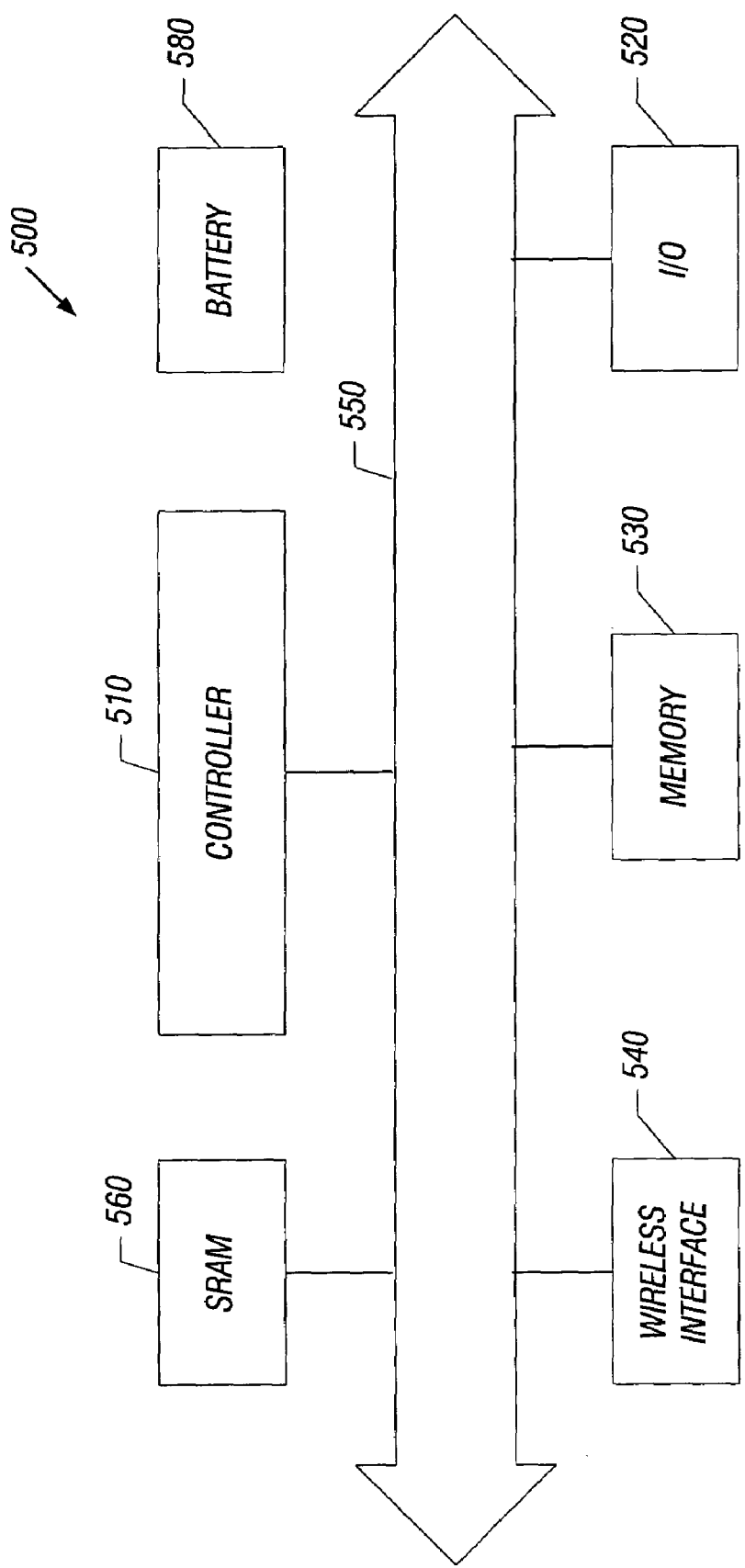
FIG. 3 is a system depiction according to one embodiment of the present invention.

Turning to FIG. 3, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wireessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, a wireless interface 540, a digital camera 550, and a static random access memory (SRAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise a volatile memory (any type of random access memory), a non-volatile memory such as a flash memory, and/or memory 10 illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   after reading a crystalline phase change memory bit, progressively decreasing the read current to substantially zero current to the phase change memory bit.

2. The method of claim 1 including reducing the read current after reading the bit.

3. The method of claim 2 including linearly reducing the read current to the memory bit.

4. The method of claim 2 including reducing the read current progressively to a bit.

5. The method of claim 1 including reducing the read current to a set bit progressively over approximately 10 nanoseconds.

6. The method of claim 1 including preventing a read disturb by progressively reducing the read current.

7. The method of claim 1 including recrystallizing a set bit alter reading said bit.

8. A method comprising:
   reading a phase change memory element in the set state and then recrystallizing said element.

9. The method of claim 8 wherein recrystallizing said element includes progressively decreasing the read current.

10. The method of claim 9 including progressively reducing the read current over approximately 10 nanoseconds.

11. The method of claim 10 including linearly reducing the read current.

12. The method of claim 8 including reducing the read current to reduce read disturb.

* * * * *

UNITED STATES PATENT AND TRADEMARK OFFICE
CERTIFICATE OF CORRECTION

| | | |
|---|---|---|
| PATENT NO. | : 7,259,982 B2 | Page 1 of 1 |
| APPLICATION NO. | : 11/029981 | |
| DATED | : August 21, 2007 | |
| INVENTOR(S) | : Brian G. Johnson | |

It is certified that error appears in the above-identified patent and that said Letters Patent is hereby corrected as shown below:

Column 10:
Line 26, Claim 7, "alter" should be --after--.

Signed and Sealed this

Twenty-fifth Day of December, 2007

JON W. DUDAS
*Director of the United States Patent and Trademark Office*